(12) United States Patent
Tani et al.

(10) Patent No.: US 6,707,838 B2
(45) Date of Patent: Mar. 16, 2004

(54) STRAY LIGHT CUTTING STRUCTURE FOR OPTICAL DEVICE

(75) Inventors: Takeharu Tani, Kaisei-machi (JP); Hiroaki Hyuga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/153,790

(22) Filed: May 24, 2002

(65) Prior Publication Data

US 2002/0186743 A1 Dec. 12, 2002

(30) Foreign Application Priority Data

May 28, 2001 (JP) ........................................ 2001-158238

(51) Int. Cl.[7] ............... H01S 3/08; H01S 3/06
(52) U.S. Cl. ................ 372/92; 372/39; 372/66; 372/103
(58) Field of Search ............ 372/103, 39, 66, 372/92

(56) References Cited

U.S. PATENT DOCUMENTS

| | | | |
|---|---|---|---|
| 4,397,547 A | * 8/1983 | Grasl | 356/1 |
| 5,093,837 A | * 3/1992 | Edwards | 372/103 |
| 5,506,860 A | 4/1996 | Iyuga et al. | |
| 5,768,304 A | * 6/1998 | Goto | 372/98 |
| 5,852,626 A | * 12/1998 | Reed | 372/103 |
| 5,909,456 A | * 6/1999 | Oka | 372/22 |
| 5,946,330 A | * 8/1999 | Ozygus et al. | 372/19 |
| 5,978,535 A | * 11/1999 | Mitsuda et al. | 385/88 |
| 5,991,068 A | * 11/1999 | Massicott et al. | 359/337 |
| 6,463,086 B1 | * 10/2002 | Stamm et al. | 372/20 |
| 6,480,639 B2 | * 11/2002 | Hashimoto et al. | 385/14 |
| 2002/0105995 A1 | * 8/2002 | Govorkov et al. | 372/57 |
| 2002/0181100 A1 | * 12/2002 | Cao | 359/484 |
| 2002/0186741 A1 | * 12/2002 | Kleinschmidt et al. | 372/57 |

FOREIGN PATENT DOCUMENTS

JP 7-263785 10/1995

* cited by examiner

*Primary Examiner*—Paul Ip
*Assistant Examiner*—James Menefee
(74) *Attorney, Agent, or Firm*—Sughrue Mion, PLLC

(57) ABSTRACT

A stray light cutting structure for an optical device provided with an optical component through which a predetermined light beam travels in parallel to the optical axis of the optical device is provided. The structure is for cutting stray light, which travels at an angle to the optical axis of the optical device to enter the optical component through one end face thereof, and includes at least one notch formed on one side face of the optical component.

75 Claims, 14 Drawing Sheets

PRIOR ART

STRAY LIGHT CUTTING STRUCTURE FOR OPTICAL DEVICE

BACKGROUND OF THE INVENTION

1. Field of the Invention

This invention relates to a stray light cutting structure for an optical device, and more particularly to a stray light cutting structure which cuts stray light which travels in such a direction as to enter an optical component in the optical device and to be reflected at a side surface thereof.

2. Description of the Related Art

In various optical devices, light reflected at a light transmitting surface of an optical component of the optical device sometimes travels through the device as stray light. For example, in a solid state laser in which an etalon is provided in a Fabry-Perot resonator at an angle to the axis of the resonator as disclosed, for instance, in Japanese Unexamined Patent Publication No. 7(1996)-263785, light reflected at a light transmitting surface of the etalon travels in a direction at an angle to the axis of the resonator.

In a Fabry-Perot resonator, oscillating light travels in parallel to optical axes of optical components such as mirrors forming the Fabry-Perot resonator, and a solid laser crystal and a wavelength convertor element disposed inside the resonator. When the stray light traveling in a direction at an angle to the axis of the resonator interferes with the oscillating light, great fluctuation in output power can occur. The problem in the solid state laser will be described in detail with reference to FIGS. 14A to 14C, hereinbelow.

It is assumed that the solid state laser comprises, as shown in FIG. 14A, a semiconductor laser 10 as a pumping light source, a condenser lens 12 which condenses a laser beam 11 emitted from the semiconductor laser 10, a solid laser crystal 13 which is pumped by the laser beam 11, a resonator mirror 14 disposed forward of the solid laser crystal 13, a wavelength convertor element 15 disposed inside a resonator formed by the resonator mirror 14 and the solid laser crystal 13, a Brewster plate 16 for polarization control and an etalon 17 for oscillating wavelength selection.

In such a solid state laser, light emitted from the solid laser crystal 13 pumped by the laser beam 11 resonates between the rear end face 13a of the laser crystal 13 and the mirror face 14a of the resonator mirror 14, whereby a solid laser beam 18 oscillates. The solid laser beam 18 is converted to its second harmonic 19 by the wavelength convertor element 15 and substantially only the second harmonic 19 emanates from the resonator mirror 14. The Brewster plate 16 controls the direction of polarization of the solid laser beam 18 and the etalon 17 selects the oscillating wavelength (i.e., a longitudinal mode) of the solid laser beam 18.

The reflectance of the etalon 17 has a strong wavelength-dependency and a wavelength to which the phases of reflection of opposite sides of the etalon are reverse to each other and accordingly, the reflectance of the etalon 17 to which is very low is selected, whereby the solid laser beam 18 oscillates at the selected wavelength. The reflectance of the etalon 17 to the solid laser beam 18 is minimized at this time and is evaluated to be about 2%. Since the etalon 17 is inclined by 1° to a direction normal to the optical axis of the resonator, stray light which is reflected at the surface of the etalon 17 in a direction at 2° to the optical axis of the resonator is generated as indicated 20 in FIG. 14A.

The stray light 20 is reflected in total reflection at a side surface 15a of the wavelength convertor element 15, which may be, for instance, a LiNbO3 crystal having periodic domain reversals, and is further reflected at the rear end face 13a of the solid laser crystal 13 provided with HR (high-reflection) coating as shown in FIG. 14B.

Further, the stray light 20 can be reflected at the surface of the etalon 17 to travel in parallel to the optical axis of the resonator as shown in FIG. 14C. That is, the stray light 20 can travel in the same direction as the solid laser beam 18 (abbreviated in FIGS. 14B and 14C) and can be sometimes superimposed on the solid laser beam 18 within the range thereof to interfere with the solid laser beam 18.

When the stray light 20 interferes with the solid laser beam 18, the state of interference varies depending on the phase state and/or the intensity of the stray light 20, which increases and reduces loss in the resonator. Accordingly, slight stray light 20 can greatly change the output power of the solid state laser. Since the phase state of the stray light 20 changes according to change of strain of optical components and the components holding them, change of temperature of the optical components and the components holding them, and the like, the resonator becomes very instable and the output power of the solid state laser greatly fluctuates according to the state during assembly and/or the time from assembly.

SUMMARY OF THE INVENTION

In view of the foregoing observations and description, the primary object of the present invention is to provide a structure for cutting stray light which travels in such a direction as to enter an optical component in the optical device and to be reflected at a side surface thereof.

In accordance with a first aspect of the present invention, there is provided a stray light cutting structure for an optical device provided with an optical component through which a predetermined light beam travels in parallel to the optical axis of the optical device, the structure being for cutting stray light, which travels at an angle to the optical axis of the optical device to enter the optical component through one end face thereof, and comprising at least one notch formed on one side face of the optical component.

In the stray light cutting structure of the first aspect, the stray light is cut after the stray light enters the optical component.

The notch may be formed only at one place in the longitudinal direction of the side face or at a plurality of places in the longitudinal direction of the side face.

When the notch is formed only at one place in the longitudinal direction of the side face of the optical component, it is preferred that the notch be formed at the middle of the optical component in the longitudinal direction thereof and the depth d1 of the notch satisfies formula d1>(L/2) tan θ wherein θ represents the angle between said one side face of the optical component and the direction of travel of the stray light in the optical component and L represents the length of the optical component.

When the notch is formed at a plurality of (N≧2) places in the longitudinal direction of the side face of the optical component, it is preferred that each of the notches be formed at the middle of each of the areas which are obtained by dividing the side face of the optical component into N equal parts in the longitudinal direction thereof and the depth d1 of each of the notches satisfies formula d1>(1/N)·(L/2) tan θ wherein θ represents the angle between said one side face of the optical component and the direction of travel of the stray light in the optical component and L represents the length of the optical component.

However the depth d1 of the notch should be limited so that the notch does not interfere with the predetermined light beam which travels in parallel to the optical axis of the optical device.

In the stray light cutting structure of the first aspect of the present invention, the stray light entering the optical component is cut by the notch when the stray light impinges upon the notch on the way to the side face of the optical component or after reflected (e.g., in total reflection) by the side face of the optical component.

In the case where a single notch is formed at the middle of the optical component in the longitudinal direction thereof, light which enters the optical component through one end thereof to be reflected at a part of the side face between said one end and the middle of the side face is all cut by the notch after reflected by the side face, whereas light which enters the optical component through one end thereof to be reflected at a part of the side face between the other end and the middle of the side face is all cut by the notch before reflected by the side face if the depth d1 of the notch satisfies formula d1>(L/2) tan θ.

In the case where the notch is formed at a plurality of (N≧2) places in the longitudinal direction of the side face of the optical component and each of the notches is formed at the middle of each of the areas which are obtained by dividing the side face of the optical component into N equal parts in the longitudinal direction thereof, light which enters each of the areas from one end thereof to be reflected at a part of the side face between said one end and the middle of the area is all cut by the notch provided in the area after reflected by the side face, whereas light which enters each of the areas from one end thereof to be reflected at a part of the side face between the other end of the area and the middle of the area is all cut by the notch provided in the area before reflected by the side face if the depth d1 of the notch satisfies formula d1>(1/N)·(L/2) tan θ.

That is, when the notch is provided at a plurality of places, light impinging upon the side face of the optical component at a given angle θ can be cut with a notch of a shorter depth d1 (=1/N) than when the notch is provided at a single place. In other words, when the notch is provided at a plurality of places, light impinging upon the side face of the optical component at a larger angle θ can be cut with a notch of a given depth d1 than when the notch is provided at a single place. This holds even if the notches are formed on the side face of the optical component at irregular intervals.

In accordance with a second aspect of the present invention, there is provided a stray light cutting structure for an optical device provided with an optical component through which a predetermined light beam travels in parallel to the optical axis of the optical device, the structure being for cutting stray light, which travels at an angle to the optical axis of the optical device to enter the optical component through one end face thereof, and comprising a diffusing surface which is formed at at least one area of the side face of the optical component to diffuse the stray light.

In the stray light cutting structure of the second aspect, the stray light is diffused and cut when the stray light impinges upon the diffusing surface after the stray light enters the optical component.

It is preferred that the diffusing surface be formed by sandblasting, rough abrasion and/or filing.

In accordance with a third aspect of the present invention, there is provided a stray light cutting structure for an optical device provided with an optical component through which a predetermined light beam travels in parallel to the optical axis of the optical device, the structure being for cutting stray light, which travels at an angle to the optical axis of the optical device to enter the optical component through one end face thereof, and comprising a chamfered portion formed on an edge portion of said one end face of the optical component and/or an edge portion of the other end face of the optical component to refract the stray light.

In the stray light cutting structure of the third aspect, the stray light is cut before the stray light enters the optical component when the chamfered portion is formed on an edge portion of said one end face of the optical component whereas the stray light is cut after the stray light enters the optical component when the chamfered portion is formed on an edge portion of the other end face of the optical component.

The chamfered portion may be formed on only one of the end faces of the optical component or on both the end faces of the optical component. In the former case, the width d2 of the chamfered portion from the side face of the optical component is preferably larger than L·tan θ, and in the latter case, the width d2 of each of the chamfered portions from the side face of the optical component is preferably larger than (L/2)·tan θ, wherein L represents the length of the optical component.

As described above with reference to FIG. 14C, stray light traveling at an angle to the optical axis of the optical device after reflected in a certain direction at an optical element like an etalon obliquely disposed inside the optical device comes to travel in parallel to the optical axis after reflected a plurality of times when it returns to the optical component in parallel to the certain direction. Accordingly, by forming a chamfered portion on an edge portion of said one end face of the optical component and/or an edge portion of the other end face of the optical component to refract the stray light, stray light which travels toward the optical component in parallel to said certain direction can be cut.

When the chamfered portion is formed on only one of the end faces of the optical component, light which is to enter the optical component through one end face thereof to impinge upon the side face at angle θ and light which impinges upon the side face at angle θ and emanates from the other end face are all refracted by the chamfered portion if the width d2 of the chamfered portion from the side face of the optical component is larger than L·tan θ.

To the contrast, when the chamfered portion is formed on both the end faces of the optical component, light which is to enter the optical component through one end face thereof to impinge upon the side face at angle θ and light which impinges upon the side face at angle θ and emanates from the other end face are all refracted by the chamfered portion on either of the end faces if the width d2 of each of the chamfered portions from the side face of the optical component is larger than (L/2)·tan θ.

That is, when the chamfered portion is provided on both the end faces of the optical component, light impinging upon the side face of the optical component at a given angle θ can be cut with a chamfered portion of a half width as compared when the chamfered portion is provided on only one of the end faces. In other words, when the chamfered portion is provided on both the end faces of the optical component, light impinging upon the side face of the optical component at a larger angle θ can be cut with a chamfered portion of a given width d2 as compared with when the chamfered portion is provided on only one of the end faces.

In accordance with a fourth aspect of the present invention, there is provided a stray light cutting structure for an optical device provided with an optical component through which a predetermined light beam travels in parallel to the optical axis of the optical device, the structure being for cutting stray light, which travels at an angle to the optical axis of the optical device to enter the optical component through one end face thereof, and comprising a diffusing surface formed on an edge portion of said one end face of the optical component and/or an edge portion of the other end face of the optical component to diffuse the stray light.

In the stray light cutting structure of the fourth aspect, the stray light is cut before the stray light enters the optical component when the diffusing surface is formed on an edge portion of said one end face of the optical component whereas the stray light is cut after the stray light enters the optical component when the diffusing surface is formed on an edge portion of the other end face of the optical component.

The diffusing surface may be formed on only one of the end faces of the optical component or on both the end faces of the optical component. In the former case, the width d3 of the diffusing surface from the side face of the optical component is preferably larger than L·tan θ, and in the latter case, the width d3 of each of the diffusing surfaces from the side face of the optical component is preferably larger than (L/2)·tan θ, wherein L represents the length of the optical component.

It is preferred that the diffusing surface be formed by sandblasting, rough abrasion and/or filing.

In the stray light cutting structure of the fourth aspect, stray light which is to enter the optical component through one end face thereof is diffused not to enter the optical component by the diffusing surface formed on said one end face of the optical component and stray light which enters the optical component through one end face thereof and emanates from the other end face of the optical component is diffused by the diffusing surface formed on the other end face of the optical component.

When the diffusing surface is formed on only one of the end faces of the optical component, light which is to enter the optical component through one end face thereof to impinge upon the side face at angle θ and light which impinges upon the side face at angle θ and emanates from the other end face are all diffused by the diffusing surface if the width d3 of the diffusing surface from the side face of the optical component is larger than L·tan θ.

To the contrast, when the diffusing surface is formed on both the end faces of the optical component, light which is to enter the optical component through one end face thereof to impinge upon the side face at angle θ and light which impinges upon the side face at angle θ and emanates from the other end face are all diffused by the diffusing surface on either of the end faces if the width d3 of each of the diffusing surface from the side face of the optical component is larger than (L/2)·tan θ.

That is, when the diffusing surface is formed on both the end faces of the optical component, light impinging upon the side face of the optical component at a given angle θ can be cut with a diffusing surface of a half width as compared when the diffusing surface is formed on only one of the end faces. In other words, when the diffusing surface is formed on both the end faces of the optical component, light impinging upon the side face of the optical component at a larger angle θ can be cut with a diffusing surface of a given width d3 as compared with when the diffusing surface is formed on only one of the end faces.

In accordance with a fifth aspect of the present invention, there is provided a stray light cutting structure for an optical device provided with an optical component through which a predetermined light beam travels in parallel to the optical axis of the optical device, the structure being for cutting stray light, which travels at an angle to the optical axis of the optical device to enter the optical component through one end face thereof, and comprising a light absorption film provided on an edge portion of said one end face of the optical component and/or an edge portion of the other end face of the optical component to absorb the stray light.

In the stray light cutting structure of the fifth aspect, the stray light is cut before the stray light enters the optical component when the light absorption film is provided on an edge portion of said one end face of the optical component whereas the stray light is cut after the stray light enters the optical component when the light absorption film is provided on an edge portion of the other end face of the optical component.

The light absorption film may be provided on only one of the end faces of the optical component or on both the end faces of the optical component. In the former case, the width d4 of the light absorption film from the side face of the optical component is preferably larger than L·tan θ, and in the latter case, the width d4 of the light absorption film on each end face from the side face of the optical component is preferably larger than (L/2)·tan θ, wherein L represents the length of the optical component.

It is preferred that the light absorption film be at least one of metal film deposited thereon, metal film bonded thereto and an adhesive film for holding the optical component.

In the stray light cutting structure of the fifth aspect, stray light which is to enter the optical component through one end face thereof is absorbed by the light absorption film provided on said one end face of the optical component and stray light which enters the optical component through one end face thereof and emanates from the other end face of the optical component is absorbed by the light absorption film on the other end face of the optical component.

When the light absorption film is provided on only one of the end faces of the optical component, light which is to enter the optical component through one end face thereof to impinge upon the side face at angle θ and light which impinges upon the side face at angle θ and emanates from the other end face are all absorbed by the light absorption film if the width d4 of the light absorption film from the side face of the optical component is larger than L·tan θ.

To the contrast, when the light absorption film is provided on both the end faces of the optical component, light which is to enter the optical component through one end face thereof to impinge upon the side face at angle θ and light which impinges upon the side face at angle θ and emanates from the other end face are all absorbed by the light absorption film on either of the end faces if the width d4 of each of the light absorption film from the side face of the optical component is larger than (L/2)·tan θ.

That is, when the light absorption film is provided on both the end faces of the optical component, light impinging upon the side face of the optical component at a given angle θ can be cut with a light absorption film of a half width as compared when the light absorption film is provided on only one of the end faces. In other words, when the light absorption film is provided on both the end faces of the optical component, light impinging upon the side face of the optical component at a larger angle θ can be cut with a light absorption film of a given width d4 as compared with when the light absorption film is provided on only one of the end faces.

In accordance with a sixth aspect of the present invention, there is provided a stray light cutting structure for an optical device provided with an optical component through which a predetermined light beam travels in parallel to the optical axis of the optical device, the structure being for cutting stray light, which travels at an angle to the optical axis of the optical device to enter the optical component through one end face thereof, and comprising a light-shielding member provided near an edge portion of said one end face of the optical component and/or an edge portion of the other end face of the optical component to cut the stray light.

In the stray light cutting structure of the sixth aspect, the stray light is cut before the stray light enters the optical component when the light-shielding member is provided near an edge portion of said one end face of the optical component whereas the stray light is cut after the stray light enters the optical component when the light-shielding member is provided near an edge portion of the other end face of the optical component.

The light-shielding member may be provided on only one of the end faces of the optical component or on both the end faces of the optical component. In the former case, the width d5 of the light-shielding member from the side face of the optical component is preferably larger than L·tan θ, and in the latter case, the width d5 of each light-shielding member from the side face of the optical component is preferably larger than (L/2)·tan θ, wherein L represents the length of the optical component.

It is preferred that the light-shielding member be formed to double as a means for holding the optical component.

In the stray light cutting structure of the sixth aspect, a light-shielding member provided near the end face (apart therefrom) cuts the stray light in place of the light absorption film in the fifth embodiment and also in the stray light cutting structure of the sixth aspect, a similar effect can be obtained.

When the light-shielding member is provided on only one of the end faces of the optical component, light which is to enter the optical component through one end face thereof to impinge upon the side face at angle θ and light which impinges upon the side face at angle θ and emanates from the other end face are all cut by the light-shielding member if the width d5 of the light-shielding member from the side face of the optical component is larger than L·tan θ.

To the contrast, when the light-shielding member is provided on both the end faces of the optical component, light which is to enter the optical component through one end face thereof to impinge upon the side face at angle θ and light which impinges upon the side face at angle θ and emanates from the other end face are all cut by the light-shielding member on either of the end faces if the width d5 of each of the light-shielding member from the side face of the optical component is larger than (L/2)·tan θ.

That is, when the light-shielding member is provided on both the end faces of the optical component, light impinging upon the side face of the optical component at a given angle θ can be cut with a light-shielding member of a half width as compared when the light-shielding member is provided on only one of the end faces. In other words, when the light-shielding member is provided on both the end faces of the optical component, light impinging upon the side face of the optical component at a larger angle θ can be cut with a light-shielding member of a given width d5 as compared with when the light-shielding member is provided on only one of the end faces.

Any of the stray light cutting structures described above is preferably applied to a case where the optical device is a laser resonator and the optical component is that disposed inside the laser resonator such as a solid laser crystal or a wavelength convertor element described above.

In this case, the output power of the solid state laser is prevented from greatly fluctuating under the influence of the stray light generated by reflection at an etalon or the like.

Further, any of the stray light cutting structures described above is preferably applied to a case where the stray light is light reflected at an optical component disposed inside a laser resonator. Such an optical component may be, for instance, an etalon described above.

Further, any of the stray light cutting structures described above is preferably applied to a case where the angle of incidence (=90°−θ) of the stray light to the side face of the optical component is an angle which satisfies the condition of total reflection.

When the angle of incidence (=90°−θ) of the stray light to the side face of the optical component is an angle which satisfies the condition of total reflection, the stray light is reflected in total reflection at an interface between the side face and air. In such a case, the intensity of the stray light is kept high and accordingly, it is preferred that the stray light be cut by the stray light cutting structure of this invention to suppress an adverse effect on an optical device which is apt to be affected by intense stray light.

DESCRIPTION OF THE PREFERRED EMBODIMENTS

Figure 1:
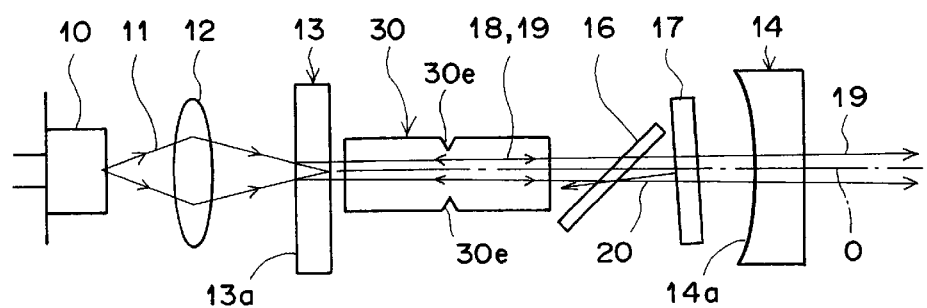
FIG. 1 is a schematic side view showing a stray light cutting structure for an optical device in accordance with a first embodiment of the present invention.
Figure 2:
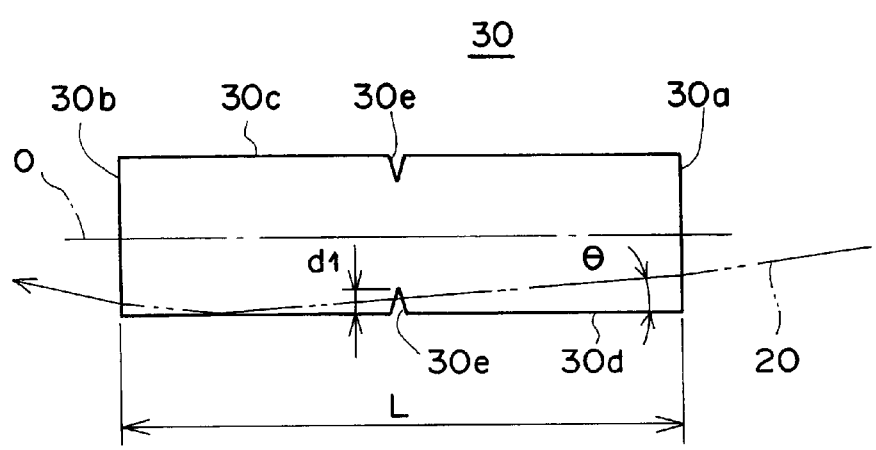
FIG. 2 is an enlarged side view of a part of the stray light cutting structure of the first embodiment.

FIG. 1 shows a semiconductor laser-pumped solid state laser provided with a stray light cutting structure in accordance with a first embodiment of the present invention, and FIG. 2 shows in an enlarged scale the wavelength convertor element employed in the solid state laser.

In FIG. 1, the semiconductor laser-pumped solid state laser comprises a semiconductor laser (a pumping light source) 10 which emits a laser beam 11, a condenser lens 12 which condenses the laser beam 11 as emitted from the semiconductor laser 10, a solid laser crystal 13 pumped by the laser beam 11, a resonator mirror 14 disposed forward of the laser crystal 13, a wavelength convertor element 30 which is disposed inside a resonator formed by the resonator mirror 14 and the solid laser crystal 13, a Brewster plate 16 for polarization control and an etalon 17 for oscillating wavelength selection.

The semiconductor laser 10 oscillates at 809 nm and is 2W in output power. The solid laser crystal 13 is Nd-doped YVO$_4$ crystal (will be referred to as "Nd:YVO$_4$ crystal", hereinbelow) which emits fluorescence of 1064 nm pumped by the laser beam 11 of 809 nm emitted from the semiconductor laser 10. The wavelength selector element 30 is a MgO-doped LiNbO3 crystal (a ferrodielectric crystal exhibiting a nonlinear optical effect, will be referred to as "MgO:LN crystal", hereinbelow) having periodic domain reversals. The left and right end faces of each of the solid laser crystal 13, the wavelength convertor element 30, the Brewster plate 16, the etalon 17 and the resonator mirror 14 are provided with coatings whose reflectances to the wavelengths of 809 nm, 1064 nm and 532 nm (the wavelength of a second harmonic of the 1064 nm solid laser to be described later) are as shown in the following table 1, where AR denotes an antireflection coating (which is not higher than about 1% in reflectance), and HR denotes a high reflectance coating (which is not lower than about 99% in reflectance).

TABLE 1

| | element | | | | | | | | | |
|---|---|---|---|---|---|---|---|---|---|---|
| | crystal | | convertor | | Brewster plate | | etalon | | mirror | |
| λ | left | right | left | right | left | right | left | right | left | right |
| 809 nm | AR | AR | AR | AR | AR | AR | AR | AR | AR | AR |
| 1064 nm | HR | AR | AR | AR | AR | AR | 60% | 60% | HR | AR |
| 532 nm | AR | HR | AR | AR | AR | AR | AR | AR | AR | AR |

In the semiconductor laser-pumped solid state laser, light emitted from the solid laser crystal 13 pumped by the laser beam 11 of 809 nm resonates between the rear end face 13a of the laser crystal 13 and the mirror face 14a of the resonator mirror 14, whereby a solid laser beam 18 of 1064 nm oscillates. The solid laser beam 18 is converted to its second harmonic 19 whose wavelength is 532 nm, a half of the wavelength of the solid laser beam 18, by the wavelength convertor element 15 and substantially only the second harmonic 19 emanates from the resonator mirror 14.

The Brewster plate 16 controls the direction of polarization of the solid laser beam 18 and the etalon 17 selects the oscillating wavelength (i.e., a longitudinal mode) of the solid laser beam 18. The Brewster plate 16 is positioned at a Brewster's angle to the axis of the resonator and the reflectances of its light transmission faces are negligible.

The solid laser crystal 13 and the wavelength convertor element 30 are positioned so that their light transmitting faces are normal to the optical axis of the resonator with their side faces in parallel to the optical axis of the resonator. In this particular embodiment, the wavelength convertor element is 0.5 mm in thickness and 4 mm is length L.

Figure 14A:
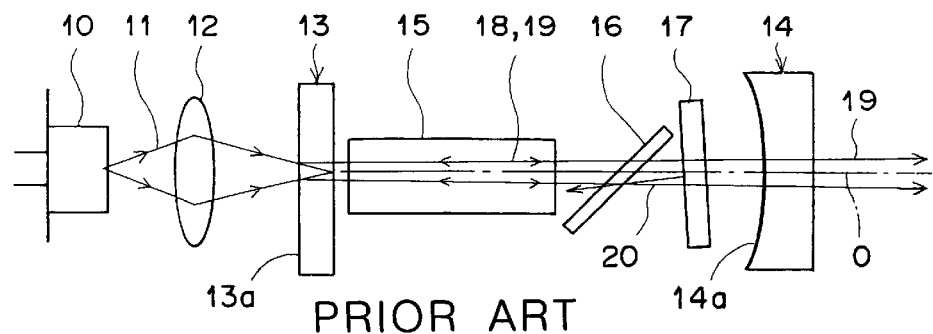
FIGS. 14A to 14C are views for illustrating generation of stray light in a known optical device.
Figure 14B:
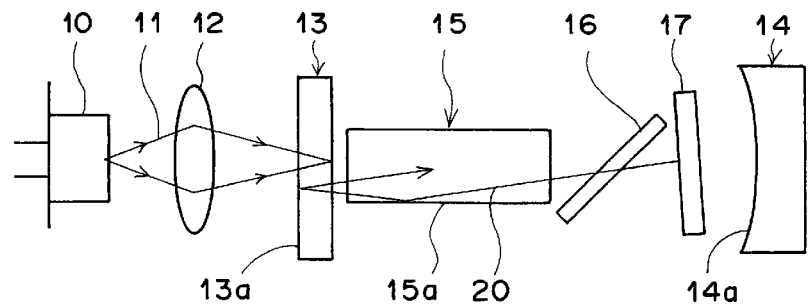
Figure 14C:
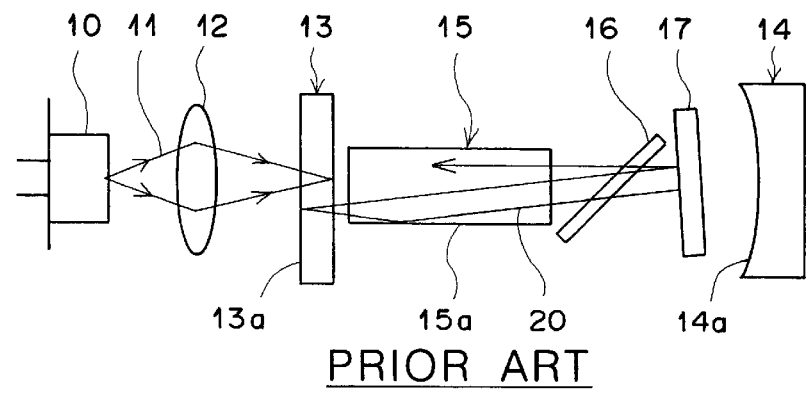

The semiconductor laser-pumped solid state laser of this embodiment is basically the same as that shown in FIGS. 14A to 14C except that the shape of the wavelength convertor element 30 differs from that of the solid state laser shown in FIGS. 14A to 14C, and accordingly, stray light can be generated due to reflection at the etalon 17 positioned at an angle to the axis of the resonator. The wavelength convertor element 30 is provided with a stray light cutting structure in accordance with a first embodiment of the present invention.

As shown in FIG. 2, the wavelength convertor element 30 is rectangular cross-section and is positioned so that the right light transmitting end face 30a thereof (the end face through which the stray light 20 from the etalon 17 enters the element 30) and the left light transmitting end face 30b thereof (the end face through which the stray light 20 emanates from the element 30) are positioned normal to the axis O of the resonator. The optical axis of the wavelength convertor element 30 itself coincides with the optical axis O of the resonator. The wavelength convertor element 30 is provided with a notch 30e which extends over the four side faces (upper and lower side faces 30c and 30d and left and right side faces) of the element all round the element 30.

Figure 3:
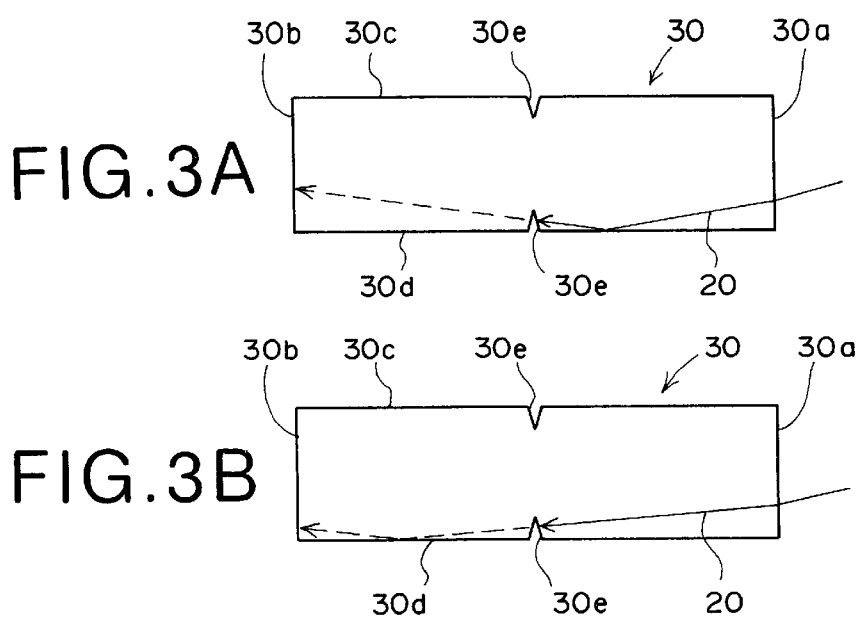
FIGS. 3A and 3B are views for illustrating the operation of the stray light cutting structure of the first embodiment.

But for the notch 30e, the stray light 20 could travel as shown by the chained line in FIG. 2 so that it is reflected at the lower side face 30d of the wavelength convertor element 30 and then returns to the etalon 17 along the optical path described above with reference to FIGS. 14A to 14C to be reflected again by the etalon 17 to interfere with the solid laser beam 18. However, in this embodiment, the stray light 20 is cut by the notch 30e after and before reflected by the lower side face 30d as shown in FIGS. 3A and 3B, respectively. In FIGS. 3A and 3B and the following drawings, the optical path along which the stray light 20 would travel but for the stray light cutting structure of the present invention is shown by the broken line.

Since the notch 30e extends over all the four side faces, stray light impinging upon the other three side faces can also be cut by the notch 30e.

As can be seen from FIG. 3A, in the case where the stray light 20 is cut by the notch 30e after reflected at the lower side face 30d, the depth d1 of the notch 30e should be maximized for the stray light 20 which impinges upon the lower side face 30d at a point at which the distance from the inlet end face 30a is extremely near 0 (such stray light will be referred to as "highest stray beam", hereinbelow). When the angle which the direction of travel of the highest stray light 20 makes to the lower side face 30d is represented by θ and the length of the wavelength convertor element 30 is represented by L, the highest stray light is at a distance of (L/2)·tan θ from the lower side face 30d at the middle thereof in the longitudinal direction. Accordingly, when the depth d1 of the notch 30e is larger than (L/2)·tan θ, that is, d1>(L/2)·tan θ, the stray light which enters the wavelength convertor element 30 through the inlet end face 30a thereof to be reflected at a part of the side face 30d between the inlet end face 30a and the middle of the side face 30d is all cut by the notch 30e after reflected at the side face 30d.

Further, as can be seen from FIG. 3B, in the case where the stray light 20 is cut by the notch 30e before reflected at the lower side face 30d, the depth d1 of the notch 30e should be maximized for the stray light 20 which impinges upon the lower side face 30d at a point at which the distance from the outlet end face 30a is extremely near 0 (such stray light will be referred to as "highest stray beam", hereinbelow). The highest stray light is at a distance of (L/2)·tan θ from the lower side face 30d at the middle thereof in the longitudinal direction. Accordingly, when the depth d1 of the notch 30e is larger than (L/2)·tan θ, that is, d1>(L/2)·tan θ, the stray light which enters the wavelength convertor element 30 through the inlet end face 30a thereof to be reflected at a part of the side face 30d between the outlet end face 30b and the middle of the side face 30d is all cut by the notch 30e after reflected at the side face 30d.

Specifically, in this particular embodiment, since the stray light 20 enters the wavelength convertor element 30 at 2° to the inlet end face 30a and the refractive index of the wavelength convertor element 30 (MgO:LN crystal) is 2.17, the angle θ is 0.92° according to Snell's law. Accordingly, in this particular embodiment, when d1>32 μm, stray light 20 can be all cut.

Since, in this particular embodiment, the angle of incidence of the stray light 20 to the lower side face 30d is 89.08° (=90°−θ) and is larger than the critical angle, the stray light 20 reflected in total reflection at the interface between the lower side face 30d and the air. In such a case, the reflectance at the lower side face 30d is almost 100% and the intensity of the stray light is kept high. However, in the semiconductor laser-pumped solid state laser, since the stray light 20 is cut by the stray light cutting structure of this embodiment, the intense stray light is prevented from generating great fluctuation in output power of the solid state laser.

Fluctuation in second harmonic output power of a solid state laser which was the same as the solid state laser shown in FIG. 1 except that the wavelength convertor element was not provided with the notch 30e was compared with that of the solid state laser shown in FIG. 1. The former was about ±30%, whereas the latter was only about ±10%.

When the direction of travel of the stray light to be cut is known on the basis of, for instance, the direction of inclination of the etalon 17, the notch 30e may be formed on selected one or more of the four side faces of the wavelength convertor element 30. For example, when only the stray light generated by the aforesaid reflection at the etalon 17 is to be cut in the arrangement shown in FIG. 1, the notch 30e may be formed only on the lower side face 30d.

A second embodiment of the present invention will be described, hereinbelow. In the second and the following embodiments, the present invention is applied to the wavelength convertor element employed in a semiconductor laser-pumped solid state laser which is the same as that shown in FIG. 1 except the structure of the wavelength convertor element.

Figure 4:
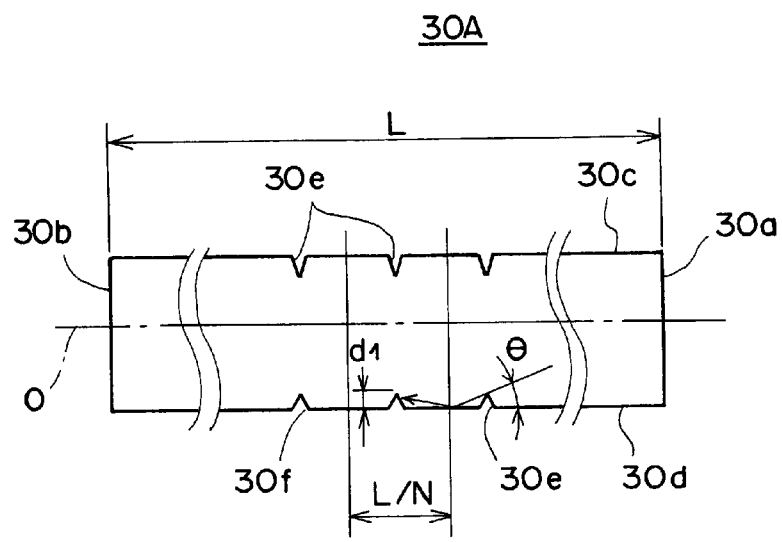
FIG. 4 is an enlarged side view of a part of a stray light cutting structure in accordance with a second embodiment of the present invention.

The second embodiment of the present invention will be first described with reference to FIG. 4, hereinbelow. In FIG. 4, the elements analogous to those shown in FIG. 2 are given the same reference numerals and will not be described here unless otherwise necessary. The semiconductor laser-pumped solid state laser of this embodiment differs from that of the first embodiment in that a wavelength convertor element 30A is employed in place of the wavelength convertor element 30. The wavelength convertor element 30A differs from the wavelength convertor element 30 in that the notches 30e are provided at a plurality of places in the longitudinal direction of the side faces thereof. That is, the notch 30e is formed at a plurality of (N≧2) places in the longitudinal direction of the side face of the optical component, each of the notches formed at the middle of each of the areas which are obtained by dividing the side face of the wavelength convertor element 30A into N equal parts in the longitudinal direction thereof.

When the notch 30e is provided at a plurality of places, light impinging upon the side face of the optical component at a given angle θ can be cut with a notch of a shorter depth d1 than when the notch is provided at a single place. In other words, when the notch is provided at a plurality of places, light impinging upon the side face of the optical component at a larger angle θ can be cut with a notch of a given depth d1 than when the notch is provided at a single place.

That is, when the notch 30e is provided at a plurality of places, the stray light 20 can be all cut provided that the depth d1 of each of the notches 30e satisfies formula d1>(1/N)·(L/2) tan θ, the reason for which will be apparent to those skilled in the art on the basis of the description above.

That the depth d1 of each notches 30e is small is preferable from the viewpoint that the mechanical strength of the wavelength convertor element can be kept high and that the notches 30e do not interfere with the solid laser beam 18 and the second harmonic 19 which the wavelength convertor element should allow to pass.

Also in this case, the notches 30e may be formed on selected one or more of the four side faces of the wavelength convertor element.

Figure 5:
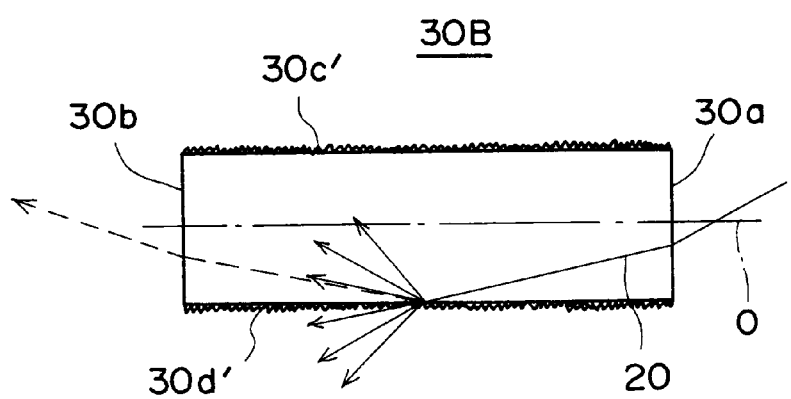
FIG. 5 is an enlarged side view of a part of a stray light cutting structure in accordance with a third embodiment of the present invention.

A third embodiment of the present invention will be described with reference to FIG. 5, hereinbelow. The semiconductor laser-pumped solid state laser of this embodiment differs from that of the first embodiment in that a wavelength convertor element 30B is employed in place of the wavelength convertor element 30. The wavelength convertor element 30B differs from the wavelength convertor element 30 in that the four side faces (upper and lower side faces 30c' and 30d' and left and right side faces) of the wavelength convertor element which are parallel to the optical axis O of the resonator are formed into a diffusing surface which diffuses the stray light 20 instead of providing the notch 30e.

The side faces can be formed into a diffusing surface by one of sandblasting, rough abrasion and filing and a combination of these techniques.

In the wavelength convertor element 30B, the stray light 20 is diffused and cut when the stray light 20 impinges upon the lower side face 30d' after the stray light 20 enters the wavelength convertor element 30B.

It is not necessary to form the entire area of each of the side faces into a diffusing surface but only a part of each of the side faces may be formed into a diffusing surface.

When the direction of travel of the stray light to be cut is known on the basis of, for instance, the direction of inclination of the etalon 17, only selected one or more of the four side faces of the wavelength convertor element 30 may be formed into a diffusing surface. For example, when only the stray light generated by the aforesaid reflection at the etalon 17 is to be cut in the arrangement shown in FIG. 1, only the lower side face 30d' may be formed into a diffusing surface.

Figure 6:
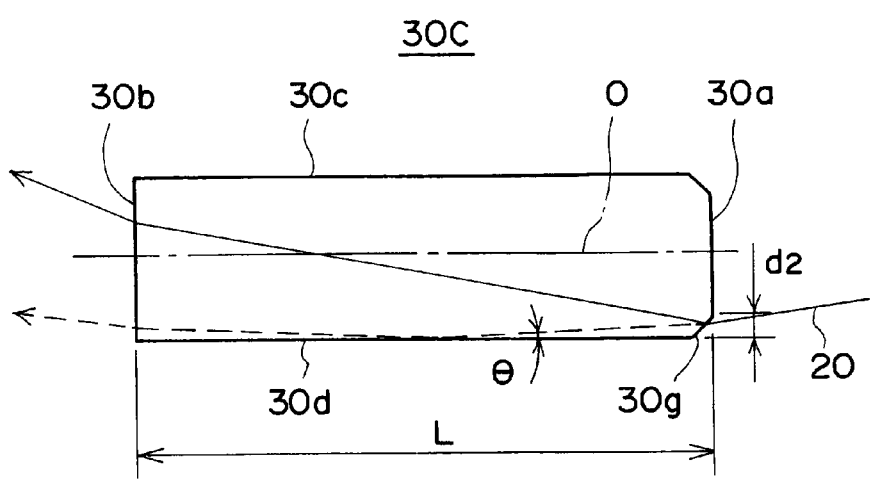
FIG. 6 is an enlarged side view of a part of a stray light cutting structure in accordance with a fourth embodiment of the present invention.

A fourth embodiment of the present invention will be described with reference to FIG. 6, hereinbelow. The semiconductor laser-pumped solid state laser of this embodiment differs from that of the first embodiment in that a wavelength convertor element 30C is employed in place of the wavelength convertor element 30. The wavelength convertor element 30C differs from the wavelength convertor element 30 in that a chamfered portion 30g is formed on the edge portion of the inlet end face 30a of the wavelength convertor element all round the inlet end face 30a instead of providing the notch 30e all round the side faces of the wavelength convertor element. The chamfered portion 30g can be formed by obliquely grinding the wavelength convertor element.

In the wavelength convertor element 30C of this embodiment, stray light 20 impinging upon the chamfered portion 30g is refracted to travel in a different direction. As described above with reference to FIG. 14C, stray light traveling at an angle to the optical axis O of the resonator after reflected in a certain direction at the etalon 17 obliquely disposed inside the resonator comes to travel in parallel to the optical axis after reflected a plurality of times when it returns the certain direction. Accordingly, when the stray light 20 is refracted by the chamfered portion 30g, the stray light 20 cannot return to the etalon 17 in parallel to said certain direction, whereby the stray light 20 is prevented from traveling in parallel to the optical axis O of the resonator.

In the case where the stray light 20 is to be refracted by the chamfered portion 30g provided on the inlet end face 30a, the width d2 of the chamfered portion 30g from the lower side face 30d should be maximized for the stray light 20 which impinges upon the lower side face 30d at a point at which the distance from the outlet end face 30b is extremely near 0 (such stray light will be referred to as "highest stray beam", hereinbelow). When the angle which the direction of travel of the highest stray light 20 makes to the lower side face 30d is represented by θ and the length of the wavelength convertor element 30 is represented by L, the highest stray light is at a distance of L·tan θ from the lower side face 30d on the inlet end face 30a. Accordingly, when the width d2 of the chamfered portion 30g is larger than L·tan θ, that is, d2>L·tan θ, the stray light which enters the wavelength convertor element 30 through the inlet end face 30a thereof is all refracted by the chamfered portion 30g.

Figure 7:
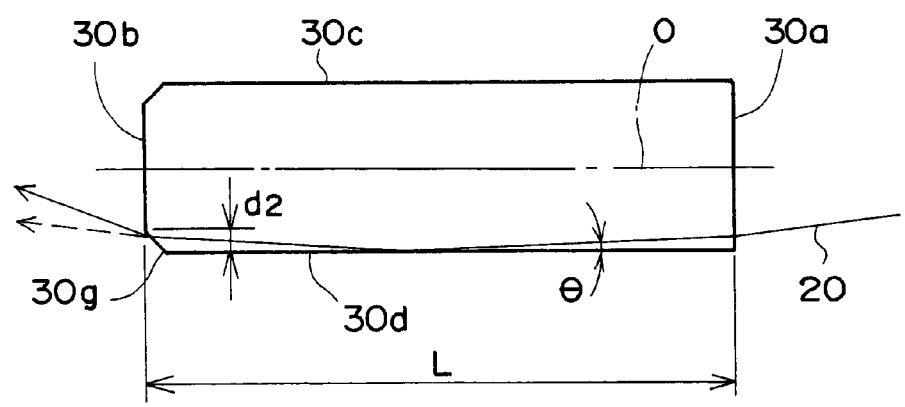
FIG. 7 is an enlarged side view of a part of a stray light cutting structure in accordance with a fifth embodiment of the present invention.

A fifth embodiment of the present invention will be described with reference to FIG. 7, hereinbelow. The semiconductor laser-pumped solid state laser of this embodiment differs from that of the fourth embodiment in that a wavelength convertor element 30D is employed in place of the wavelength convertor element 30C. The wavelength convertor element 30D differs from the wavelength convertor element 30C in that the chamfered portion 30g is formed on the edge portion of the outlet end face 30b of the wavelength convertor element all round the outlet end face 30b instead of the inlet end face 30a.

In the wavelength convertor element 30D of this embodiment, stray light 20 impinging upon the chamfered portion 30g when emanating from the outlet end face 30b is refracted to travel in a different direction, whereby generation of stray light traveling in parallel to the optical axis O of the resonator can be prevented.

In the case where the stray light 20 is to be refracted by the chamfered portion 30g provided on the outlet end face 30b, the width d2 of the chamfered portion 30g from the lower side face 30d should be maximized for the stray light 20 which impinges upon the lower side face 30d at a point at which the distance from the inlet end face 30a is extremely near 0 (such stray light will be referred to as "highest stray beam", hereinbelow). When the angle which the direction of travel of the highest stray light 20 makes to the lower side face 30d is represented by θ and the length of the wavelength convertor element 30 is represented by L, the highest stray light is at a distance of L·tan θ from the lower side face 30d on the outlet end face 30b. Accordingly, when the width d2 of the chamfered portion 30g is larger than L·tan θ, that is, d2>L·tan θ, the stray light which emanates from the wavelength convertor element 30 through the outlet end face 30b thereof is all refracted by the chamfered portion 30g.

Figure 8:
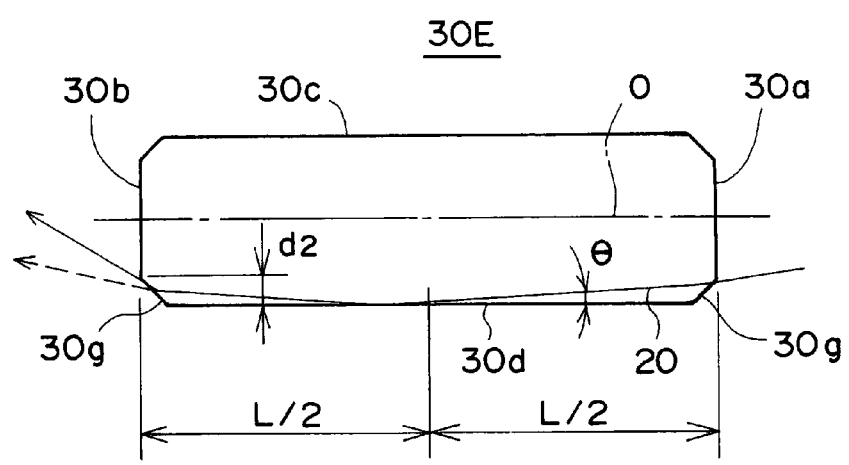
FIG. 8 is an enlarged side view of a part of a stray light cutting structure in accordance with a sixth embodiment of the present invention.

A sixth embodiment of the present invention will be described with reference to FIG. 8, hereinbelow. The semiconductor laser-pumped solid state laser of this embodiment differs from that of the fifth embodiment in that a wavelength convertor element 30E is employed in place of the wavelength convertor element 30D. The wavelength convertor element 30E differs from the wavelength convertor element 30D in that the chamfered portion 30g is formed on both the inlet end face 30a and the outlet end face 30b of the wavelength convertor element.

In the wavelength convertor element 30D of this embodiment, stray light 20 impinging upon the chamfered portion 30g on either of the inlet end face 30a and the outlet end face 30b is refracted to travel in a different direction, whereby generation of stray light traveling in parallel to the optical axis O of the resonator can be prevented.

When the chamfered portion 30g is formed on both the end faces, the chamfered portion 30g on the inlet end face 30 a may refract only the stray light which would be reflected at the half (L/2in length) of the lower side faces 30d on the side of the inlet end face 30a whereas the chamfered portion 30g on the outlet end face 30a may refract only the stray light which would be reflected at the half (L/2in length) of the lower side faces 30d on the side of the outlet end face 30a. Accordingly, when the width d2 of each chamfered portion 30g is larger than (L/2)·tan θ, that is, d2>(L/2)·tan θ, the stray light 20 can be all refracted by the chamfered portion 30g. That the width d2 of each chamfered portion 30g may be half is preferable from the viewpoint that the chamfered portion 30g does not interfere with the solid laser beam 18 and the second harmonic 19 which the wavelength convertor element should allow to pass.

The chamfered portion 30g need not be formed all round the end face of the wavelength convertor element. For example, when the direction of travel of the stray light to be cut is known on the basis of, for instance, the direction of inclination of the optical element which generates stray light, the chamfered portion 30g may be formed along selected one or more of the four edges of end face of the wavelength convertor element 30. This is true for the wavelength convertor elements 30C and 30D respectively shown in FIGS. 6 and 7.

Figure 9:
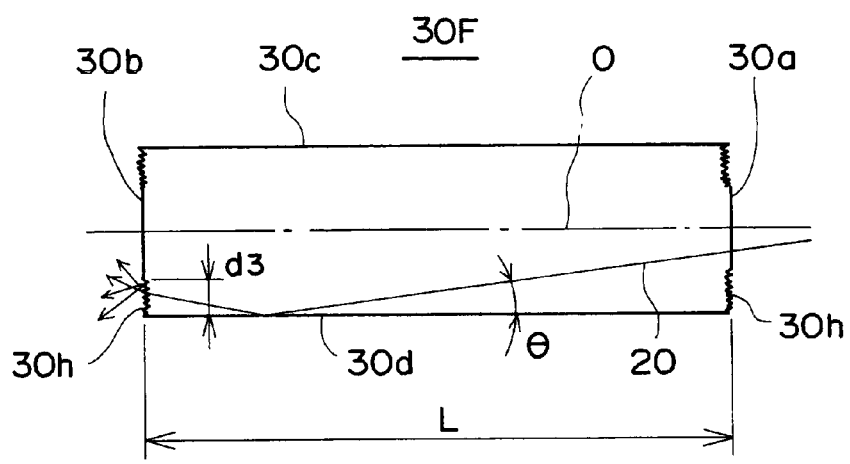
FIG. 9 is an enlarged side view of a part of a stray light cutting structure in accordance with a seventh embodiment of the present invention.

A seventh embodiment of the present invention will be described with reference to FIG. 9, hereinbelow. The semiconductor laser-pumped solid state laser of this embodiment differs from that of the sixth embodiment in that a wavelength convertor element 30F is employed in place of the wavelength convertor element 30E. The wavelength convertor element 30F differs from the wavelength convertor element 30E in that a diffusing surface 30h is formed on the edge portion of each of the end faces 30a and 30b of the wavelength convertor element all round thereof instead of the chamfered portion 30g. The diffusing surface 30h can be formed by one of sandblasting, rough abrasion and filing and a combination of these techniques.

In the wavelength convertor element 30F of this embodiment, stray light 20 impinging upon the diffusing surface 30h on either of the inlet end face 30a and the outlet end face 30b is diffused, whereby generation of stray light traveling in parallel to the optical axis O of the resonator can be prevented.

In this embodiment, when the width d3 of each diffusing surface 30h is larger than (L/2)·tan θ, that is, d3>(L/2)·tan θ, the stray light 20 can be all diffused by the diffusing surface 30h for the same reason as the reason why the width d2 of each chamfered portion 30g is made larger than (L/2)·tan θ in the sixth embodiment described above.

The diffusing surface 30h may be provided only on one of the end faces 30a and 30b. However, in this case, in order to diffuse all the stray light 20 traveling at an angle θ to the lower side face 30d, the width d3 of the diffusing surface 30h should be larger than L·tan θ, that is, d3>L·tan θ. Accordingly, it is preferred that the diffusing surface 30h be provided on both the end faces 30a and 30b from the viewpoint that the diffusing surface 30h does not interfere with the solid laser beam 18 and the second harmonic 19 which the wavelength convertor element should allow to pass.

The diffusing surface 30h need not be formed all round the end faces of the wavelength convertor element. For example, when the direction of travel of the stray light to be cut is known on the basis of, for instance, the direction of inclination of the optical element which generates stray light, the diffusing surface 30h may be formed along selected one or more of the four edges of the end faces of the wavelength convertor element 30. This is true in the case where the diffusing surface 30h is formed on only one of the end faces 30a and 30b.

Figure 10:
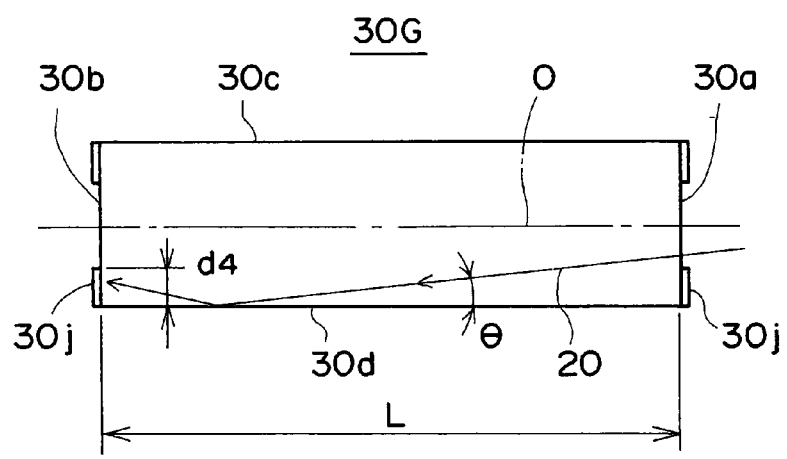
FIG. 10 is an enlarged side view of a part of a stray light cutting structure in accordance with an eighth embodiment of the present invention.

An eighth embodiment of the present invention will be described with reference to FIG. 10, hereinbelow. The semiconductor laser-pumped solid state laser of this embodiment differs from that of the sixth embodiment in that a wavelength convertor element 30G is employed in place of the wavelength convertor element 30E. The wavelength convertor element 30G differs from the wavelength convertor element 30E in that a light absorption film 30j is provided on the edge portion of each of the end faces 30a and 30b of the wavelength convertor element all round thereof instead of the chamfered portion 30g. The light absorption film 30j can be formed by depositing metal such as Al, Cr, Au or the like.

In the wavelength convertor element 30G of this embodiment, stray light 20 impinging upon the light absorption film 30j on either of the inlet end face 30a and the outlet end face 30b is absorbed, whereby generation of stray light traveling in parallel to the optical axis O of the resonator can be prevented.

In this embodiment, when the width d4 of each light absorption film 30j is larger than (L/2)·tan θ, that is, d3> (L/2)·tan θ, the stray light 20 can be all absorbed by the light absorption film 30j for the same reason as the reason why the width d2 of each chamfered portion 30g is made larger than (L/2)·tan θ in the sixth embodiment described above.

The light absorption film 30j may be provided only on one of the end faces 30a and 30b. However, in this case, in order to absorb all the stray light 20 traveling at an angle θ to the lower side face 30d, the width d4 of the light absorption film 30j should be larger than L·tan θ, that is, d4>L·tan θ. Accordingly, it is preferred that the light absorption film 30j be provided on both the end faces 30a and 30b from the viewpoint that light absorption film 30j does not interfere with the solid laser beam 18 and the second harmonic 19 which the wavelength convertor element should allow to pass.

The light absorption film 30j need not be provided all round the end faces of the wavelength convertor element. For example, when the direction of travel of the stray light to be cut is known on the basis of, for instance, the direction of inclination of the optical element which generates stray light, the light absorption film 30j may be provided along selected one or more of the four edges of the end faces of the wavelength convertor element 30. This is true in the case where the light absorption film 30j is provided on only one of the end faces 30a and 30b.

Figure 11:
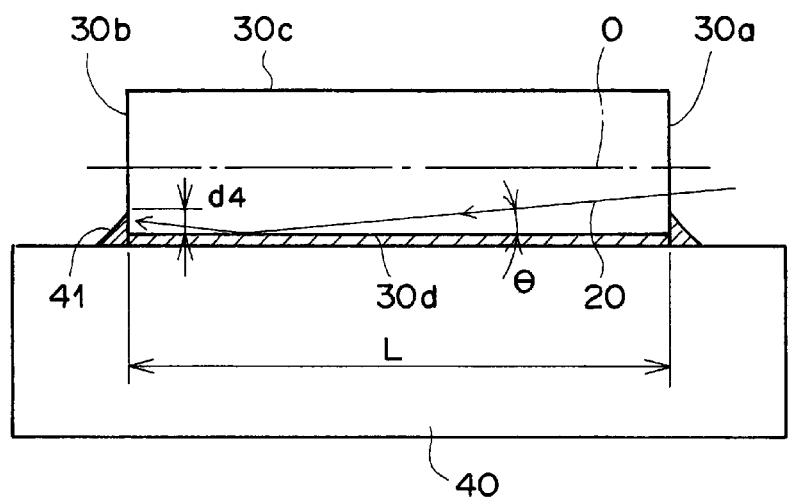
FIG. 11 is an enlarged side view of a part of a stray light cutting structure in accordance with a ninth embodiment of the present invention.

A ninth embodiment of the present invention will be described with reference to FIG. 11, hereinbelow. The semiconductor laser-pumped solid state laser of this embodiment differs from that of the sixth embodiment in that a wavelength convertor element 30H is employed in place of the wavelength convertor element 30E. The wavelength convertor element 30H is fixed to the upper surface of a holder 40 at the lower side face 30d thereof by an adhesive layer 41. The adhesive layer 41 extends beyond the edges of the lower side face 30d to a part of the end faces 30a and 30b by a width d4. The extension of the adhesive layer 41 on the respective end faces 30a and 30b function as a light absorption film which absorbs the stray light 20.

In the wavelength convertor element 30H of this embodiment, stray light 20 impinging upon the extension of the adhesive layer 41 on either of the inlet end face 30a and the outlet end face 30b is absorbed, whereby generation of stray light traveling in parallel to the optical axis O of the resonator can be prevented.

In this embodiment, a preferable range of the width d4 of the extension of the adhesive layer 41 is the same as that of the width d4 of the light absorption film 30j in the eighth embodiment.

The light absorption film maybe provided, for instance, by bonding a metal film to the end face of the wavelength convertor element as well as by depositing metal on the end face of the wavelength convertor element or by applying adhesive to the end face of the wavelength convertor element.

Figure 12:
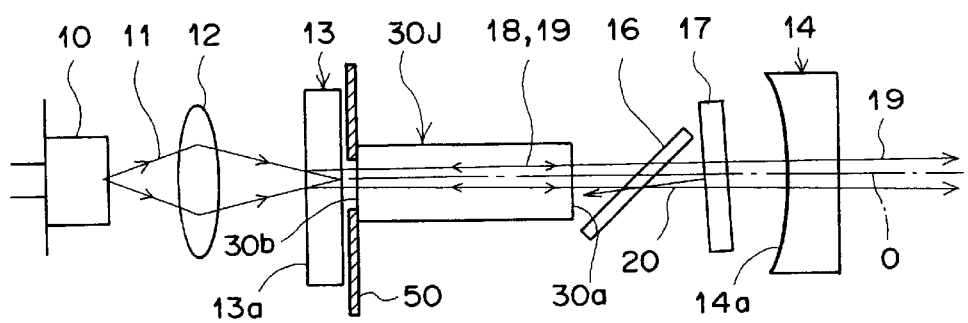
FIG. 12 is a schematic side view showing a stray light cutting structure for an optical device in accordance with a tenth embodiment of the present invention.

A tenth embodiment of the present invention will be described with reference to FIG. 12, hereinbelow. The semiconductor laser-pumped solid state laser of this embodiment differs from that of the sixth embodiment in that a wavelength convertor element 30J is employed in place of the wavelength convertor element 30E. The wavelength convertor element 30J is provided with a light-shielding member 50 in close contact with the outlet end face 30b of the wavelength convertor element 30d. The light-shielding member 50 need not be in contact with the outlet end face 30b of the wavelength convertor element 30d so long as it is disposed sufficiently close to the outlet end face 30b. The light-shielding member 50 is formed of a light-absorbing black plate material and is provided with a rectangular opening so that is covers the four edge portions of the outlet end face 30b.

The stray light 20 which is reflected at the lower side face of the wavelength convertor element 30J and emanates from the wavelength convertor element 30J through the outlet end face 30b is absorbed by the light-shielding member 50.

The light-shielding member 50 need not cover all the four edge portions of the outlet end face 30b but may cover selected one or more of the four edge portions.

A similar light-shielding member 50 may be provided in close contact with or sufficiently close to the inlet end face 30a in place of the outlet end face 30b to absorb the stray light 20 which would enter the wavelength convertor element 30J. The light-shielding member 50 may be provided on each end face of the wavelength convertor element 30J.

Figure 13:
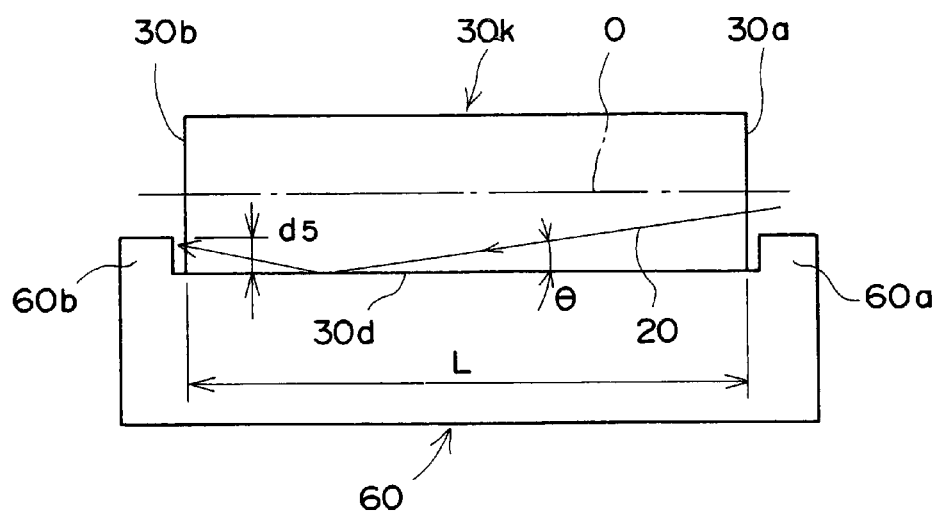
FIG. 13 is an enlarged side view of a part of a stray light cutting structure in accordance with an eleventh embodiment of the present invention.

An eleventh embodiment of the present invention will be described with reference to FIG. 13, hereinbelow. The semiconductor laser-pumped solid state laser of this embodiment differs from that of the sixth embodiment in that a wavelength convertor element 30K is employed in place of the wavelength convertor element 30E. The wavelength convertor element 30K is fixed to a holder 60, for instance, by bonding the lower side face 30d to the upper surface of the holder 60. The holder 60 has front and rear light-shielding portions 60a and 60b which are respectively positioned in close contact with or sufficiently close to the inlet end face 30a and the outlet end face 30b of the wavelength convertor element 30K.

In the wavelength convertor element 30K of this embodiment, stray light 20 impinging upon the lower side face 30d at the rear half thereof is absorbed by the rear light-shielding portion 60b and stray light 20 which travels to enter the wavelength convertor element 30K and impinge upon the lower side face 30d at the front half thereof is absorbed by the front light-shielding portion 60a.

In this embodiment, when the width d5 of each light-shielding portion from the lower side face 30d is larger than $(L/2) \cdot \tan \theta$, that is, $d5>(L/2) \cdot \tan \theta$, the stray light 20 can be all absorbed for the same reason as the reason why the width d2 of each chamfered portion 30g is made larger than $(L/2) \cdot \tan \theta$ in the sixth embodiment described above.

The light-shielding portion may be provided only on one of the end faces 30a and 30b. However, in this case, in order to absorb all the stray light 20 traveling at an angle $\theta$ to the lower side face 30d, the width d5 of the light-shielding portion should be larger than $L \cdot \tan \theta$, that is, $d5>L \cdot \tan \theta$. Accordingly, it is preferred that the light-shielding member be provided on both the end faces 30a and 30b from the viewpoint that the light-shielding member does not interfere with the solid laser beam 18 and the second harmonic 19 which the wavelength convertor element should allow to pass.

Though, in the embodiments described above, the present invention is applied to a wavelength convertor element disposed in a laser resonator, the present invention may be applied in order to prevent interference between oscillating light and stray light generated by reflection at other optical element in the laser resonator such as the laser crystal, thereby preventing fluctuation of the output power of the laser.

Further, the present invention may be applied to various optical elements other than those disposed in the laser resonator. For example, the present invention may be applied to prevent interference between the main light beam and stray light generated to travel at a particular angle to, for instance, an AOM (acousto-optic modulator) or a diffraction grating.

What is claimed is:

1. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis of the optical device to enter the optical component through one of the end faces, and comprising at least one notch formed on one of the side faces of the optical component, wherein the notch is formed only at the middle of the optical component in the longitudinal direction thereof and the depth d1 of the notch satisfies formula $d1>(L/2)\tan \theta$ wherein $\theta$ represents the angle between said one side face of the optical component and the direction of travel of the stray light in the optical component and L represents the length of the optical component.

2. A stray light cutting structure as defined in claim 1 in which said optical component is disposed inside a laser resonator.

3. A stray light cutting structure as defined in claim 2 in which said optical component is a solid laser crystal.

4. A stray light cutting structure as defined in claim 2 in which said optical component is a wavelength convertor element.

5. A stray light cutting structure as defined in claim 2 in which the stray light is light reflected at a second optical component disposed inside the laser resonator.

6. A stray light cutting structure as defined in claim 5 in which said second optical component is an etalon.

7. A stray light cutting structure as defined in claim 1 in which the angle of incidence of the stray light to the side face of the optical component is an angle which satisfies the condition of total reflection.

8. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis of the optical device to enter the optical component through one of the end faces, and comprising at least one notch formed on one of the side faces of the optical component, wherein the notch is formed at a plurality of ($N \geq 2$) places in the longitudinal direction of the side face of the optical component, and wherein each of the notches is formed at the middle of each of the areas which are obtained by dividing the side face of the optical component into N equal parts in the longitudinal direction thereof and the depth d1 of each of the notches satisfies formula $d1>(1/N) \cdot (L/2)\tan \theta$ wherein $\theta$ represents the angle between said one side face of the optical component and the direction of travel of the stray light in the optical component and L represents the length of the optical component.

9. A stray light cutting structure as defined in claim 8 in which said optical component is disposed inside a laser resonator.

10. A stray light cutting structure as defined in claim 9 in which said optical component is a solid laser crystal.

11. A stray light cutting structure as defined in claim 9 in which said optical component is a wavelength convertor element.

12. A stray light cutting structure as defined in claim 9 in which the stray light is light reflected at a second optical component disposed inside the laser resonator.

13. A stray light cutting structure as defined in claim 12 in which said second optical component is an etalon.

14. A stray light cutting structure as defined in claim 8 in which the angle of incidence of the stray light to the side face of the optical component is an angle which satisfies the condition of total reflection.

15. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis to enter the optical component through one of the end faces, and comprising a chamfered portion formed on an edge portion of at least one of the end faces of the optical component to refract the stray light, wherein said chamfered portion is formed on only one of the end faces of the optical component and the width d2 of the chamfered portion from the side face of the optical component is larger than L·tan θ, wherein θ represents the angle between said one side face of the optical component and the direction of travel of the stray light in the optical component and L represents the length of the optical component.

16. A stray light cutting structure as defined in claim 15 in which said optical component is disposed inside a laser resonator.

17. A stray light cutting structure as defined in claim 16 in which said optical component is a solid laser crystal.

18. A stray light cutting structure as defined in claim 16 in which said optical component is a wavelength convertor element.

19. A stray light cutting structure as defined in claim 16 in which the stray light is light reflected at a second optical component disposed inside the laser resonator.

20. A stray light cutting structure as defined in claim 19 in which said second optical component is an etalon.

21. A stray light cutting structure as defined in claim 15 in which the angle of incidence of the stray light to the side face of the optical component is an angle which satisfies the condition of total reflection.

22. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis to enter the optical component through one of the end faces, and comprising a chamfered portion formed on an edge portion of at least one of the end faces of the optical component to refract the stray light, wherein said chamfered portion is formed on both the end faces of the optical component and the width d2 of each of the chamfered portions from the side face of the optical component is larger than (L/2)·tan θ, wherein θ represents the angle between said one side face of the optical component and the direction of travel of the stray light in the optical component and L represents the length of the optical component.

23. A stray light cutting structure as defined in claim 22 in which said optical component is disposed inside a laser resonator.

24. A stray light cutting structure as defined in claim 23 in which said optical component is a solid laser crystal.

25. A stray light cutting structure as defined in claim 23 in which said optical component is a wavelength convertor element.

26. A stray light cutting structure as defined in claim 23 in which the stray light is light reflected at a second optical component disposed inside the laser resonator.

27. A stray light cutting structure as defined in claim 26 in which said second optical component is an etalon.

28. A stray light cutting structure as defined in claim 22 in which the angle of incidence of the stray light to the side face of the optical component is an angle which satisfies the condition of total reflection.

29. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis to enter the optical component through one of the end faces, and comprising a diffusing surface formed on an edge portion of at least one of the end faces of the optical component to diffuse the stray light, wherein said diffusing surface is formed on only one of the end faces of the optical component and the width d3 of the diffusing surface from the side face of the optical component is larger than L·tan θ, wherein θ represents the angle between said one side face of the optical component and the direction of travel of the stray light in the optical component and L represents the length of the optical component.

30. A stray light cutting structure as defined in claim 29 in which said diffusing surface is formed by sandblasting, rough abrasion and/or filing.

31. A stray light cutting structure as defined in claim 29 in which said optical component is disposed inside a laser resonator.

32. A stray light cutting structure as defined in claim 31 in which said optical component is a solid laser crystal.

33. A stray light cutting structure as defined in claim 31 in which said optical component is a wavelength convertor element.

34. A stray light cutting structure as defined in claim 31 in which the stray light is light reflected at a second optical component disposed inside the laser resonator.

35. A stray light cutting structure as defined in claim 34 in which said second optical component is an etalon.

36. A stray light cutting structure as defined in claim 29 in which the angle of incidence of the stray light to the side face of the optical component is an angle which satisfies the condition of total reflection.

37. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis to enter the optical component through one of the end faces, and comprising a diffusing surface formed on an edge portion of at least one of the end faces of the optical component to diffuse the stray light, wherein said diffusing surface is formed on both the end faces of the optical component and the width d3 of each of the diffusing surfaces from the side face of the optical component is larger than (L/2)·tan θ, wherein θ represents the angle between said one side face of the optical component and the direction of travel of the stray light in the optical component and L represents the length of the optical component.

38. A stray light cutting structure as defined in claim 37 in which said diffusing surface is formed by sandblasting, rough abrasion and/or filing.

39. A stray light cutting structure as defined in claim 37 in which said optical component is disposed inside a laser resonator.

40. A stray light cutting structure as defined in claim 39 in which said optical component is a solid laser crystal.

41. A stray light cutting structure as defined in claim 39 in which said optical component is a wavelength convertor element.

42. A stray light cutting structure as defined in claim 39 in which the stray light is light reflected at a second optical component disposed inside the laser resonator.

43. A stray light cutting structure as defined in claim 42 in which said second optical component is an etalon.

44. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis to enter the optical component through one of the end faces, and comprising
   a light absorption film provided on an edge portion of at least one of the end faces of the optical component to absorb the stray light,
   wherein said light absorption film is provided on only one of the end faces of the optical component and, the width d4 of the light absorption film from the side face of the optical component is larger than L·tan θ, wherein θ represents the angle between said one side face of the optical component and the direction of travel of the stray light in the optical component and L represents the length of the optical component.

45. A stray light cutting structure as defined in claim 44 in which said light absorption film comprises at least one of metal film deposited thereon, metal film bonded thereto and an adhesive film for holding the optical component.

46. A stray light cutting structure as defined in claim 44 in which said optical component is disposed inside a laser resonator.

47. A stray light cutting structure as defined in claim 46 in which said optical component is a solid laser crystal.

48. A stray light cutting structure as defined in claim 46 in which said optical component is a wavelength convertor element.

49. A stray light cutting structure as defined in claim 46 in which the stray light is light reflected at a second optical component disposed inside the laser resonator.

50. A stray light cutting structure as defined in claim 49 in which said second optical component is an etalon.

51. A stray light cutting structure as defined in claim 44 in which the angle of incidence of the stray light to the side face of the optical component is an angle which satisfies the condition of total reflection.

52. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis to enter the optical component through one of the end faces, and comprising
   a light absorption film provided on an edge portion of at least one of the end faces of the optical component to absorb the stray light,
   wherein said light absorption film is provided on both the end faces of the optical component and the width d4 of the light absorption film on each end face from the side face of the optical component is larger than (L/2)·tan θ, wherein θ represents the angle between said one side face of the optical component and the direction of travel of the stray light in the optical component and L represents the length of the optical component.

53. A stray light cutting structure as defined in claim 52 in which said light absorption film comprises at least one of metal film deposited thereon, metal film bonded thereto and an adhesive film for holding the optical component.

54. A stray light cutting structure as defined in claim 52 in which said optical component is disposed inside a laser resonator.

55. A stray light cutting structure as defined in claim 54 in which said optical component is a solid laser crystal.

56. A stray light cutting structure as defined in claim 54 in which said optical component is a wavelength convertor element.

57. A stray light cutting structure as defined in claim 54 in which the stray light is light reflected at a second optical component disposed inside the laser resonator.

58. A stray light cutting structure as defined in claim 57 in which said second optical component is an etalon.

59. A stray light cutting structure as defined in claim 52 in which the angle of incidence of the stray light to the side face of the optical component is an angle which satisfies the condition of total reflection.

60. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis to enter the optical component through one of the end faces, and comprising
   a light-shielding member provided near an edge portion of at least one of the end faces of the optical component to cut the stray light,
   wherein said light-shielding member is provided on only one of the end faces of the optical component and the width d5 of the light-shielding member from the side face of the optical component is larger than L·tan θ, wherein θ represents the angle between said one side face of the optical component and the direction of travel of the stray light in the optical component and L represents the length of the optical component.

61. A stray light cutting structure as defined in claim 60 in which said light-shielding member is formed to double as a means for holding the optical component.

62. A stray light cutting structure as defined in claim 60 in which said optical component is disposed inside a laser resonator.

63. A stray light cutting structure as defined in claim 62 in which said optical component is a solid laser crystal.

64. A stray light cutting structure as defined in claim 62 in which said optical component is a wavelength convertor element.

65. A stray light cutting structure as defined in claim 62 in which the stray light is light reflected at a second optical component disposed inside the laser resonator.

66. A stray light cutting structure as defined in claim 65 in which said second optical component is an etalon.

67. A stray light cutting structure as defined in claim 60 in which the angle of incidence of the stray light to the side face of the optical component is an angle which satisfies the condition of total reflection.

68. A stray light cutting structure for an optical device provided with an optical component, which includes a plurality of side faces longitudinal to an optical axis of the optical device and a plurality of end faces transverse to the optical axis, and through which a predetermined light beam travels in parallel to the optical axis, the structure being for cutting stray light, which travels at an angle to the optical axis to enter the optical component through one of the end faces, and comprising a light-shielding member provided near an edge portion of at least one of the end faces of the optical component to cut the stray light, wherein said light-shielding member is provided on both the end faces of the optical component and the width d5 of each light-shielding member from the side face of the optical component is larger than $(L/2) \cdot \tan \theta$, wherein $\theta$ represents the angle between said one side face of the optical component and the direction of travel of the stray light in the optical component and L represents the length of the optical component.

69. A stray light cutting structure as defined in claim 68 in which said light-shielding member is formed to double as a means for holding the optical component.

70. A stray light cutting structure as defined in claim 68 in which said optical component is disposed inside a laser resonator.

71. A stray light cutting structure as defined in claim 70 in which said optical component is a solid laser crystal.

72. A stray light cutting structure as defined in claim 70 in which said optical component is a wavelength convertor element.

73. A stray light cutting structure as defined in claim 70 in which the stray light is light reflected at a second optical component disposed inside the laser resonator.

74. A stray light cutting structure as defined in claim 73 in which said second optical component is an etalon.

75. A stray light cutting structure as defined in claim 68 in which the angle of incidence of the stray light to the side face of the optical component is an angle which satisfies the condition of total reflection.

* * * * *